(12) United States Patent
Schaadt et al.

(10) Patent No.: US 7,575,038 B2
(45) Date of Patent: Aug. 18, 2009

(54) SINGLE CRYSTAL SEED

(75) Inventors: Steven T. Schaadt, Whitehall, MI (US);
Brad J. Murphy, Whitehall, MI (US);
Lisa K. Koivisto, Hart, MI (US)

(73) Assignee: Howmet Research Corporation, Whitehall, MI (US)

( * ) Notice: Subject to any disclaimer, the term of this patent is extended or adjusted under 35 U.S.C. 154(b) by 0 days.

(21) Appl. No.: 09/878,772

(22) Filed: Jun. 11, 2001

(65) Prior Publication Data

US 2002/0185247 A1 Dec. 12, 2002

(51) Int. Cl.
*B22D 25/06* (2006.01)
*B22C 9/00* (2006.01)

(52) U.S. Cl. .................................. 164/122.2; 164/361
(58) Field of Classification Search .............. 164/122.1, 164/122.2, 361, 516
See application file for complete search history.

(56) References Cited

U.S. PATENT DOCUMENTS

| | | | |
|---|---|---|---|
| 3,260,505 A * | 7/1966 | Ver Snyder ................. 416/179 |
| 3,494,709 A * | 2/1970 | Piearcey ..................... 416/232 |
| 3,607,139 A | 9/1971 | Hanks .......................... 117/32 |
| 3,763,926 A * | 10/1973 | Tschinkel et al. ......... 164/338.1 |
| 4,092,183 A | 5/1978 | Grundy ........................ 148/32 |
| 4,209,348 A * | 6/1980 | Duhl et al. .................. 148/555 |
| 4,289,570 A * | 9/1981 | Terkelsen ................. 164/122.1 |
| 4,353,405 A * | 10/1982 | Kolakowski et al. ...... 164/122.2 |
| 4,412,577 A * | 11/1983 | Salkeld et al. ............ 164/122.2 |
| 4,580,613 A | 4/1986 | Miller et al. ............. 164/122.1 |
| 4,683,936 A | 8/1987 | Cybulsky et al. ......... 164/122.1 |
| 4,900,394 A * | 2/1990 | Mankins ...................... 117/10 |
| 5,047,091 A | 9/1991 | Khan et al. ..................... 148/3 |
| 5,062,468 A | 11/1991 | Monte et al. ............. 164/122.2 |
| 5,062,469 A | 11/1991 | Monte et al. ............. 164/122.2 |
| 5,291,937 A | 3/1994 | Corderman et al. ........ 164/92.1 |
| 5,304,039 A | 4/1994 | Corderman et al. ...... 416/241 R |
| 5,611,670 A | 3/1997 | Yoshinari et al. ........ 416/241 R |
| 5,682,747 A | 11/1997 | Brown et al. .................. 60/746 |
| 5,778,960 A | 7/1998 | Jackson et al. ................ 164/98 |
| 2002/0007778 A1* | 1/2002 | Ford et al. ..................... 117/1 |

FOREIGN PATENT DOCUMENTS

| | | |
|---|---|---|
| GB | 1260195 | 1/1972 |
| GB | 2 037 200 A * | 7/1980 |
| GB | 2037200 | 7/1980 |
| JP | 2092888 | 3/1990 |
| JP | 8253830 | 1/1996 |
| WO | 9418363 | 8/1994 |

OTHER PUBLICATIONS

E.P. Whelan, "Cobalt-Free Nickle-Base Wrought Superalloys", Superalloys, 1980, pp. 53-62.

* cited by examiner

*Primary Examiner*—Kevin P Kerns

(57) ABSTRACT

A single crystal seed for use in casting a single crystal article, consisting essentially of, in weight %, about 5.0% to about 40.0% Mo, up to 0.1% C and balance essentially Ni.

7 Claims, 1 Drawing Sheet

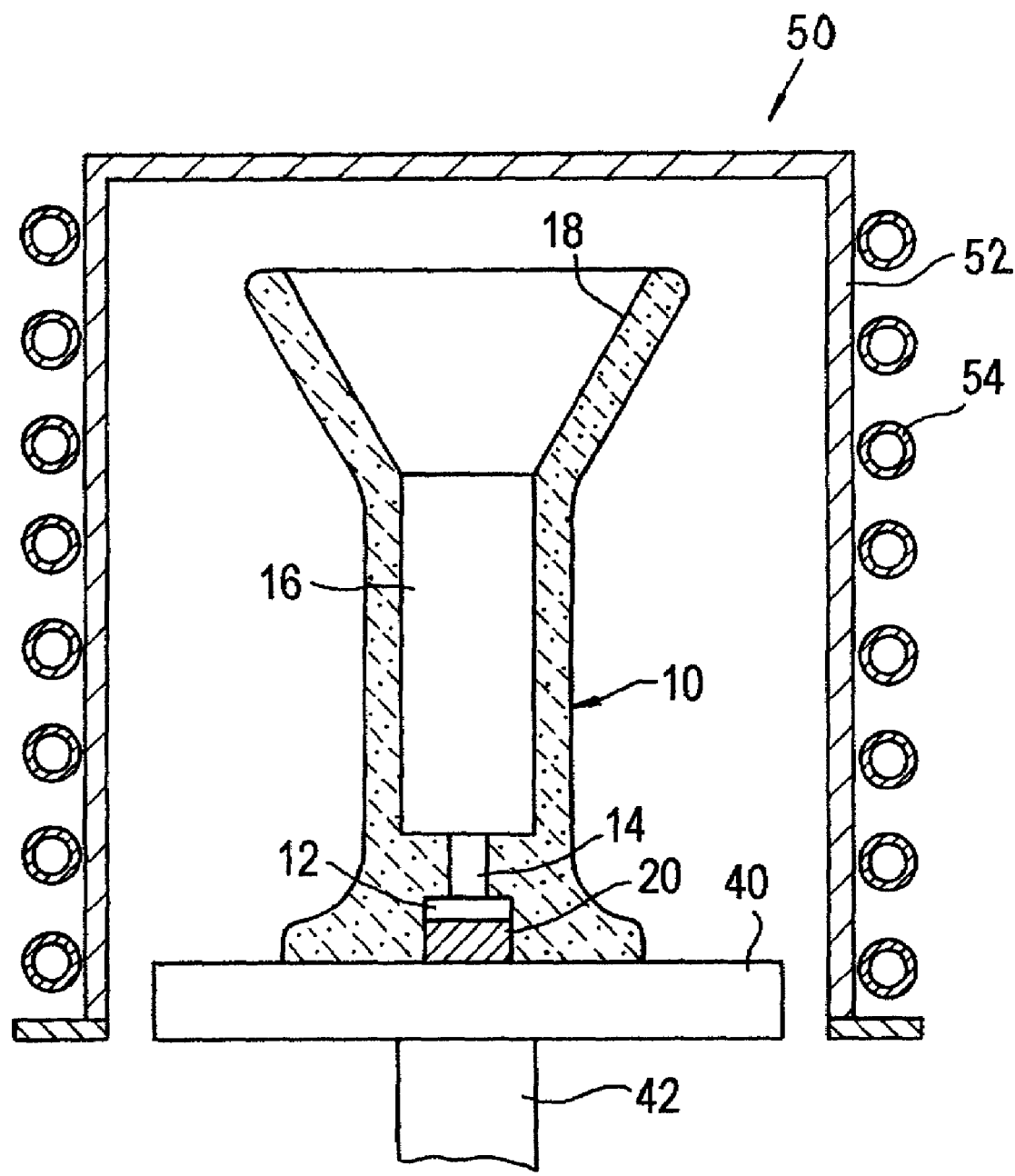

SINGLE CRYSTAL SEED

FIELD OF THE INVENTION

The present invention relates to single crystal casting using a seed crystal in a ceramic shell mold.

BACKGROUND OF THE INVENTION

Single crystal casting and solidification of molten metal using a ceramic investment shell mold positioned on a chill plate is well known in the art of investment casting to produce such components as single crystal gas turbine engine blades and vanes. In one mode of single crystal casting, the ceramic shell mold includes a lower grain starter cavity having a single crystal seed positioned therein. The seed is communicated to an upper mold cavity. The seed is placed in or otherwise communicated to the lower starter cavity of a ceramic shell mold that is preformed using the well known lost wax process. When molten metal is introduced into the shell mold, a single crystal is expected to grow epitaxially upwardly from the seed with a preselected crystallographic orientation determined by the seed for propagation through the molten metal in the mold cavity. During single crystal solidification, the melt-filled shell mold is withdrawn from a casting furnace to establish unidirectional heat removal from the molten metal in the mold to produce a solidification front of the single crystal through the molten metal in the mold cavity to form the single crystal casting.

Single crystal seeds used heretofore in casting nickel base superalloys have employed seed alloy compositions similar to that of the nickel base superalloy to be cast. Such seeds can experience oxide growth on the seed surfaces at the elevated mold preheat temperatures employed in single crystal casting. This oxide growth occurs while preheating the mold in a vacuum casting furnace and can result in nucleation of spurious grains that grow in the starter cavity instead of the expected single crystal. Such spurious grain nucleation and growth in the starter cavity can result in an increase in scrap castings by virtue of their having a grain orientation outside a preselected specification (e.g. where the [001] crystal axis must be within a certain range of degrees relative to the z axis of the turbine airfoil).

An object of the present invention is to provide a single crystal seed as well as casting mold and method for making a single crystal casting that overcome the above problem of oxide growth and spurious grain nucleation and the need for special gating schemes.

SUMMARY OF THE INVENTION

In an embodiment of the present invention, a single crystal seed is provided for casting nickel alloys and cobalt alloys as single crystals wherein the seed comprises one or more alloying elements selected from the group consisting of Mo, Cr, W, Ta, Re, Nb, and V in certain amounts and the balance Ni and/or Co. The seed can be used to cast single crystal nickel base superalloy articles such as turbine blades and vanes as well as nickel alloy and cobalt alloy seeds for use in single crystal casting of nickel base superalloys.

For example, in an illustrative embodiment of the present invention, a single crystal seed is provided consisting essentially of, in weight %, about 5.0% to about 40.0% Mo, up to 0.1% C and/or B, and balance essentially Ni. The seed is resistant to oxide growth under single crystal mold preheating conditions to overcome the above problems of oxide growth and spurious grain nucleation and the need for special gating schemes.

The seed is positioned in a starter cavity of a single crystal casting mold to initiate epitaxial grain nucleation and growth in molten metallic material residing in an article mold cavity.

The above objects and advantages of the present invention will become more readily apparent from the following detailed description taken with the following drawings.

DESCRIPTION OF THE DRAWINGS

The FIGURE is a sectional view of a ceramic investment shell mold having a single crystal seed pursuant to an illustrative embodiment of the invention residing in a grain starter cavity.

DESCRIPTION OF THE INVENTION

An illustrative embodiment of the present invention involves oxide-resistant single crystal seeds for use in casting of single crystal nickel base superalloys as single crystal airfoils, such as turbine blades and vanes, of a gas turbine engine, and other article shapes. Another illustrative embodiment of the present invention involves oxide-resistant single crystal seeds for casting of nickel alloy seed bodies and cobalt alloy seed bodies that can be used in single crystal casting processes to make other articles, such as the aforementioned single crystal nickel base superalloy airfoils.

Referring the FIGURE, a ceramic investment shell mold 10 includes a single crystal seed 20 in the form a cast nickel alloy or cobalt alloy body 21 residing in a grain starter cavity 12 at the lower end of the mold. The grain starter cavity 12 is communicated at its upper end by a connector passage 14 to an article mold cavity 16 having the shape of the article to be cast. The article to be cast can be a gas turbine engine airfoil, such as a turbine blade or vane, or any other product shape. The article to be cast also can be a single crystal seed body 21 itself to be used in single crystal casting of nickel base superalloy articles. The pour cup 18 is provided above the mold cavity 16 to feed molten metal or alloy to the article cavity and starter cavity. The grain starter cavity 12 is communicated at its lower end to a conventional chill plate 40 on a ram 42 of a conventional casting machine that embodies the well known Bridgeman mold withdrawal technique. The seed 20 can sit directly on the chill plate 40 or be disposed in the mold out of contact with the chill plate.

The single crystal seed 20 can be incorporated in the starter cavity 12 using conventional shell mold fabrication techniques where a wax pattern assembly comprising the starter cavity, connector passage, and article cavity is formed and invested in ceramic shell mold material using the well known lost wax process. After the pattern assembly is removed from the shell mold invested thereon, the shell mold is fired at an elevated temperature to develop mold strength for casting. The seed 20 then is inserted into the open end of the starter cavity 12. The seed typically is a cast cylindrical body 21 in shape, although other seed shapes or configurations can be used in practicing the invention. Alternatively, the single crystal seed 20 can be attached to the wax assembly and then the shell mold is built-up around the assembly and the seed 20.

The present invention envisions a seed 20 comprising one or more alloying elements selected from the group consisting of Mo, Cr, W, Ta, Re, Nb, and V in certain amounts and the balance Ni, Co or combinations thereof. The listed alloying elements are precipitation hardening alloyants that form precipitates with Ni or Co, or with one another or other alloyants, upon being subjected to a suitable precipitation hardening heat treatment. One or more of C and B may optionally be present in the seed 20.

Pursuant to an illustrative embodiment of the present invention, the seed 20 consists essentially of, in weight %, about 5.0% to about 40.0% Mo, up to 0.1% of an element selected from the group consisting of C and B and combinations thereof, and balance selected from the group consisting of Ni and Co and combinations thereof. A preferred composition of the seed 20 for casting nickel base superalloys and nickel alloy seed bodies 21 consists essentially of, in weight %, about 15% to about 30% Mo, 0 to about 0.05% C and/or B, and balance essentially Ni. A preferred composition of the seed 20 for casting cobalt alloy seed bodies 21 consists essentially of, in weight %, about 8% to about 28% Mo, 0 to about 0.05% C and/or B, and balance essentially Co. The Mo content within the ranges set forth imparts oxidation resistance, solid solution strengthening, and precipitation hardenability to the seed 20. The C and/or B content within the ranges set forth imparts alloy cleanliness and/or liquidus/solidus temperature control to the seed 20. The seed 20 is resistant to oxidation and oxide growth at the high mold preheating temperature of typical single crystal casting processing to overcome the above problems of oxide growth and spurious grain nucleation as well as the need for special gating schemes. The mold 10 with the seed 20 of the invention can be filled with molten superalloy through the upper pour cup 18 at its upper end while the mold resides in the vacuum casting furnace as is well known or by any conventional other mold filling technique.

In other illustrative embodiments of the present invention, the alloying element(s) can be selected from one or more of the group consisting of Mo, Cr, W, Ta, Re, Nb, V and combinations thereof in appropriate concentration(s) in a nickel alloy or cobalt alloy seed 20 to precipitation harden the seed upon suitable heat treatment.

For example, for purposes of illustration and not limitation, a nickel based alloy seed 20 can comprise 1) about 15 weight % to about 47 weight % Cr and balance Ni and optionally up to 0.1 weight % C and/or B, 2) about 10 weight % to about 45 weight % W and balance Ni and optionally up to 0.1 weight % C and/or B, 3) about 15 weight % to about 33 weight % Ta and balance Ni and optionally up to 0.1 weight % C and/or B, 4) about 8 weight % to about 13 weight % Re and balance Ni and optionally up to 0.1 weight % C and/or B, 5) about 5 weight % to about 18 weight % Nb and balance Ni and optionally up to 0.1 weight % C and/or B, 6) about 5 weight % to about 30 weight % V and balance Ni and optionally up to 0.1 weight % C and/or B.

For purposes of further illustration and not limitation, a cobalt based alloy seed 20 can comprise 1) about 2 weight % to about 37 weight % Cr and balance Co and optionally up to 0.1 weight % C and/or B, 2) about 10 weight % to about 40 weight % W and balance Co and optionally up to 0.1 weight % C and/or B, 3) about 5 weight % to about 44 weight % Ta and balance Co and optionally up to 0.1 weight % C and/or B, 4) about 5 weight % to about 36 weight % Re and balance Co and optionally up to 0.1 weight % C and/or B, 5) about 1 weight % to about 12 weight % Nb and balance Co and optionally up to 0.1 weight % C and/or B, 6) about 2 weight % to about 28 weight % V and balance Co and optionally up to 0.1 weight % C and/or B.

The seed 20 is provided with a crystallographic orientation to be imparted to the single crystal casting in the article cavity 16 by epitaxial solidification therefrom as is well known. For example only, for most face centered cubic nickel base superalloys, the seed crystal can have a [001] crystal axis oriented parallel to the z axis of a turbine airfoil to be cast in the mold cavity 16. The seed 20 can be formed with the desired crystallographic orientation by casting the seed 20 with the desired orientation, or the seed can be physically oriented to provide a casting with a desired orientation relative to the mold cavity 16.

The seed 20 can be used in the as-cast seed condition or optionally can be precipitation hardened after casting by heat treatment prior to placing the seed 20 in the shell mold. The heat treatment is conducted at temperatures and times to form precipitates of one or more of the above-listed precipitation hardening elements (e.g. Mo, Cr, W, Ta, Re, Nb, and/or V) with Ni or Co and/or with one another or other alloyants present. The temperatures and times employed for the precipitation hardening heat treatment will depend on the seed alloy composition used. The temperatures and times of the heat treatment can be determined from phase diagrams of the particular seed alloy employed and/or empirically from heat treatment evaluation tests.

For casting single crystal nickel base superalloys and nickel and cobalt seed alloys, the shell mold 10 typically is heated in a vacuum casting furnace 50 having a susceptor 52 inductively heated by induction coil 54 to an elevated temperature in the range of 2700 to 2900 degrees F. prior to pouring of molten superheated alloy therein. The vacuum level (subambient pressure) in the casting furnace typically is less than 15 microns. The temperature of the superheated molten alloy will depend on the alloy being cast and generally is in the range of 200 to 500 degrees F. above the alloy melting point.

After the molten alloy is poured into pour cup 18, it flows downwardly to fill the mold cavity 16 and the starter cavity 12, whereby the molten alloy melts an upper region of the seed 20. The ram 42 is moved to withdraw the mold 10 from the casting furnace 50 to establish a solidification front in the molten alloy that progresses upwardly from the starter cavity 12 through the connector passage 14 and the article cavity 16 in known manner to form a single crystal cast article therein as described for example, in Ver Snyder U.S. Pat. No. 3,260,505 and Piearcey U.S. Pat. No. 3,494,709, which are incorporated by reference herein.

Use of the oxidation-resistant seed 20 pursuant to the invention reduces or eliminates spurious grain nucleation in the starter cavity 12. Casting defects due to grain misorientation are significantly reduced by practice of the invention.

The following Examples are offered to further illustrate, but not limit, the invention:

EXAMPLES

A nickel base superalloy known as CMSX-10 was superheated to 2750 degrees F. and poured into mold 10 heated to 2825 degrees F. in a vacuum casting furnace. The single crystal seed 20 comprised Ni-26.6 weight % Mo (i.e. 26.6 weight % Mo and balance Ni) and was precipitation hardened prior to placement in the mold by heat treatment at 1400 degrees F. for 6 hours and air cooled to ambient temperature. The seed did not exhibit substantial oxidation such that no spurious grain nucleation occurred in the starter cavity 12.

CMSX-10 also was superheated to 3015 degrees F. and poured into a shell mold 10 heated to 2825 degrees F. in a vacuum casting furnace. The seed 20 comprised Ni-27.52 weight % Mo and was precipitation hardened prior to placement in the mold by heat treatment at 1400 degrees F. for 6 hours and air cooled to ambient temperature. The seed did not exhibit substantial oxidation such that no spurious grain nucleation occurred in the starter cavity 12.

A nickel base superalloy known as Rene' N5 was superheated to 2700 degrees F. and poured into mold 10 heated to 2825 degrees F. in a vacuum casting furnace. The seed 20 comprised Ni-25 weight % Mo and was precipitation hardened prior to placement in the mold by heat treatment at 1400 degrees F. for 6 hours and air cooled to ambient temperature. The seed did not exhibit substantial oxidation such that no spurious grain nucleation occurred in the starter cavity 12.

Rene' N5 also was superheated to 2700 degrees F. and poured into mold 10 heated to 2825 degrees F. in a vacuum casting furnace. The seed 20 comprised Ni-15 weight % Mo-0.05 weight % C and was precipitation hardened prior to placement in the mold by heat treatment at 910 degrees F. for 6 hours and air cooled to ambient temperature. The seed did not exhibit substantial oxidation such that no spurious grain nucleation occurred in the starter cavity 12.

Rene' N5 also was superheated to 2700 degrees F. and poured into mold 10 heated to 2825 degrees F. in a vacuum casting furnace. The seed 20 comprised Ni-26.4 weight % Mo and was precipitation hardened prior to placement in the mold by heat treatment at 910 degrees F. for 6 hours and air cooled to ambient temperature. The seed did not exhibit substantial oxidation such that no spurious grain nucleation occurred in the starter cavity 12.

A fourth generation single crystal nickel base superalloy was superheated to 2725 degrees F. and poured into mold 10 heated to 2825 degrees F. in a vacuum casting furnace. The seed 20 comprised Ni-27 weight % Mo and was precipitation hardened prior to placement in the mold by heat treatment at 1400 degrees F. for 6 hours and air cooled to ambient temperature. The seed did not exhibit substantial oxidation such that no spurious grain nucleation occurred in the starter cavity 12.

A nickel single crystal seed alloy comprising 20 weight % Mo and balance Ni was superheated to 2880 degrees F. and poured into mold 10 heated to 2825 degrees F. in a vacuum casting furnace. The seed 20 comprised Ni-25 weight % Mo and was precipitation hardened prior to placement in the mold by heat treatment at 1400 degrees F. for 6 hours and air cooled to ambient temperature. The seed did not exhibit substantial oxidation such that no spurious grain nucleation occurred in the starter cavity 12.

A nickel single crystal seed alloy comprising 20 weight % Re and balance Ni was superheated to 2900 degrees F. and poured into mold 10 heated to 2825 degrees F. in a vacuum casting furnace. The seed 20 comprised Ni-25 weight % Mo and was precipitation hardened prior to placement in the mold by heat treatment at 1400 degrees F. for 6 hours and air cooled to ambient temperature. The seed did not exhibit substantial oxidation such that no spurious grain nucleation occurred in the starter cavity 12.

A nickel single crystal seed alloy comprising 25 weight % Mo and balance Ni was superheated to 2700 degrees F. and poured into mold 10 heated to 2825 degrees F. in a vacuum casting furnace. The seed 20 comprised Ni-25 weight % Mo and was precipitation hardened prior to placement in the mold by heat treatment at 1400 degrees F. for 6 hours and air cooled to ambient temperature. The seed did not exhibit substantial oxidation such that no spurious grain nucleation occurred in the starter cavity 12.

A nickel single crystal seed alloy comprising 27 weight % Mo and balance Ni was superheated to 2700 degrees F. and poured into mold 10 heated to 2825 degrees F. in a vacuum casting furnace. The seed 20 comprised Ni-25 weight % Mo and was precipitation hardened prior to placement in the mold by heat treatment at 1400 degrees F. for 6 hours and air cooled to ambient temperature. The seed did not exhibit substantial oxidation such that no spurious grain nucleation occurred in the starter cavity 12.

A nickel single crystal seed alloy comprising 27 weight % Mo and balance Ni was superheated to 2700 degrees F. and poured into mold 10 heated to 2825 degrees F. in a vacuum casting furnace. The seed 20 comprised Ni-27 weight % Mo and was precipitation hardened prior to placement in the mold by heat treatment at 1400 degrees F. for 6 hours and air cooled to ambient temperature. The seed did not exhibit substantial oxidation such that no spurious grain nucleation occurred in the starter cavity 12.

Although the invention has been described in detail above with respect to certain embodiments, those skilled in the art will appreciate that modifications, changes and the like can be made therein without departing from the spirit and scope of the invention as set forth in the appended claims.

We claim:

1. A seed for casting a single crystal article, said seed having a molten metallic material-contacting region that is exposed to and melted by molten metallic material that is epitaxially solidified from said seed in a heated mold, consisting essentially of, in weight %, about 25% to about 40.0% Mo, up to 0.1% of an element selected from the group consisting of C and B and balance essentially Ni.

2. The seed of claim 1 consisting essentially of, in weight %, about 25% to about 30% Mo, up to about 0.05% C, and balance essentially Ni.

3. The seed of claim 1 which is heat treated to precipitation harden it.

4. A single crystal casting mold for receiving a molten metallic material, comprising a grain starter cavity connected to an article mold cavity by a connector passage and a seed as set forth in claim 1 in said starter cavity wherein said region of said seed is exposed to and melted by contact with the molten metallic material received in said mold.

5. A single crystal casting mold for receiving a molten metallic material, comprising a grain starter cavity connected to an article mold cavity by a connector passage and a seed in said starter cavity wherein said region of said seed is exposed to and melted by contact with the molten metallic material received in said mold, said seed consisting essentially of, in weight %, about 25% to about 40.0% Mo, up to 0.1% C and balance selected from the group consisting of Ni and Co.

6. The mold of claim 5 wherein said seed consists essentially of, in weight %, about 25% to about 30% Mo, up to about 0.05% C, and balance essentially Ni.

7. A method of casting a single crystal article, comprising disposing a seed as set forth in claim 1 in a grain starter cavity communicated to an article mold cavity of a mold, heating the mold, introducing molten superalloy in the heated mold, contacting the molten superalloy with said molten metallic material-contacting region of said seed, and epitaxially solidifying said molten superalloy from said seed in the heated mold.

* * * * *